United States Patent [19]

Bogdanow

[11] Patent Number: 5,064,971

[45] Date of Patent: Nov. 12, 1991

[54] DEVICE FOR FASTENING AN ELECTRICAL CABLE TO AN INSULATOR

[76] Inventor: Anatol L. Bogdanow, 166 Olive Street, Holland Landing, Ontario L0G 1H0, Canada

[21] Appl. No.: 421,132

[22] Filed: Oct. 13, 1989

[51] Int. Cl.[5] .......................................... H10B 17/16

[52] U.S. Cl. .................................. 174/169; 174/186; 174/191

[58] Field of Search .................. 174/161 R, 169, 176, 174/186, 188, 191; 24/135 R, 135 K; 248/65, 70, 74.1, 74.4; 403/165

[56] References Cited

U.S. PATENT DOCUMENTS

| | | | |
|---|---|---|---|
| 955,185 | 4/1910 | McCallum | 174/169 X |
| 1,221,894 | 4/1917 | Neeley | 174/191 X |
| 1,239,902 | 9/1917 | Goodard | 174/186 X |
| 3,267,206 | 8/1966 | Leonard, Jr. | 174/169 |
| 3,737,560 | 6/1973 | Takatori et al. | 174/169 X |
| 3,836,102 | 9/1974 | Hall | 174/169 X |

FOREIGN PATENT DOCUMENTS

| | | | |
|---|---|---|---|
| 426784 | 3/1926 | Fed. Rep. of Germany | 174/169 |

*Primary Examiner*—Leo P. Picard
*Assistant Examiner*—Trinidad Korka
*Attorney, Agent, or Firm*—Weiser & Stapler

[57] ABSTRACT

An improved fastening device. The fastener portion itself usually comprises a vise rotatably mounted on a base for connection to a support. In a first preferred embodiment the vise is mounted on a cylindrical stem rotatably mounted within a housing of the base having a cylindrical bore, the axis of rotation of the stem thus being the axis of rotation of the vise. In a second preferred embodiment, the base provides a cylindrical stem and the vise provides a housing with a cylindrical bore in which the stem is rotatably mounted. The vise has a pair of jaws between which a cable is fastened such that the neutral axis of the fastened cable is substantially perpendicular to the rotational axis of the vise.

13 Claims, 5 Drawing Sheets

DEVICE FOR FASTENING AN ELECTRICAL CABLE TO AN INSULATOR

BACKGROUND OF THE INVENTION

1. Field of the Invention

The invention relates to an improvement in line post conductor fastener assemblies for line post tie tops for overhead distribution and transmission of electrical circuits. In particular, this invention provides a conductor fastening device with a base for mounting on standard type insulators, and a fastener element being rotatable on its base about an axis which is generally parallel to the longitudinal axis of the insulator on which it is mounted.

2. Background of the Invention

In conventional systems, where electrical cables are held by line post conductor clamps on clamp tops mounted on the post through porcelain insulators, some problems may be encountered. Vibrations, for example, caused by wind, may set up galloping in the cables. Galloping exerts considerable stresses and strains on the insulators themselves and may cause breakage. The conventional design of conductor clamps and line post clamp tops also requires considerable on-site assembly by the installer or repair person. The line post clamp top must be assembled with pivot pins in the appropriate orientation and the line post conductor clamp must be connected to it under operating conditions at the top of the post, which may not be ideal for this work. Examples of conventional line post clamp tops and line post conductor clamps are described in U.S. Pat. No. 1,239,902 (Goddard, Sept. 11, 1917), German Patent 426,784, (Mar. 19, 1926) and U.S. Pat. No. 3,737,560 (Takatori et al., June 5, 1973).

Line post clamp tops in common use have pivot pins for locating sockets of the conductor clamps so that the clamp itself has movement about an axis so that it may, to some extent, follow the movement of the cable to which it is clamped. Such a clamp top may be mounted atop a longitudinally upstanding insulator, that is, "vertically mounted", or it may be mounted at the end of a longitudinally horizontal insulator, that is, "horizontally mounted". In either situation, a fastening member, such as a vise, is pivotally mounted by pivot pins to a bracket connected to a base which is mounted to the insulator. The fastening member is mounted such that its pivotal axis is horizontal and orthogonal to the general direction of the clamped cable. This requires the provision of two types of bases: one type having the bracket oriented to provide proper pivoting for vertical mounting and a second type having its bracket oriented to provide proper pivoting for horizontal mounting. Besides requiring a different base for each type of mounting, this arrangement generally provides, for horizontally mounted insulators, a pivotal axis substantially coaxial with the longitudinal axis of the insulator while the cable itself is distanced from the axis This distance increases stress on the insulator, as the distance from the cable to the longitudinal axis induces a torque about the insulator top neck when the cable is subjected to a force.

The use of the present invention will also eliminate the need to acquire specialized line post tie tops which are adapted to receive a cable directly. In addition, the present invention can be used to replace the specialized pin type insulators which are currently used in heavy duty applications on high voltage transmission lines.

BRIEF SUMMARY OF THE INVENTION

The invention is a fastening device, which may be used for either a horizontal or vertical mount, which comprises a fastener element and a base on which the fastener element is rotatably mounted.

Fastening devices embodying the invention may be used to secure conducting cables to conventional insulators, which typically have a circular top neck for mounting cf a conductor clamp, etc., the top neck being centered about a major central axis of the insulator. Such embodiments thus have a base having a socket into which the top neck of the insulator fits and may be secured therein by conventional means. Typically, embodiments of this invention utilize a clamping vise as the fastener element, the vise being mounted on the base such that the pivotal axis about which the vise may rotate is coaxial with the major central axis of the insulator when the fastener is properly mounted thereon.

In a first preferred embodiment, described and illustrated in detail below, there is a vise integrally connected with a stem and the base provides a housing with a bore to receive the stem. The arrangement is such that the neutral axis of a wire clamped into the vise is generally perpendicular to the axis of the stem, and the stem is received securely but rotatably within the bore so as to be capable of rotating about its axis which is coaxial with the major central axis of the insulator when the fastening device is properly mounted thereon.

In the first preferred embodiment, one jaw of the vise is rigidly formed with the stem and the second is connected thereto so as to permit an installer to move it into a closed position such that a wire between the two jaws is firmly clamped between the two jaws.

In preferred embodiments, the second jaw is mounted by means of a threaded bore therein onto a rotatable bolt. Rotation of the bolt in one direction moves the second jaw closer to the first jaw while rotation in the opposite direction moves the second jaw away from the first jaw.

In preferred embodiments the jaws are shaped and oriented such that if the fastening device is mounted vertically, that is, atop an insulator or is mounted horizontally, a conducting cable may rest between the jaws of the vise when it is in its open position.

In a first preferred embodiment, the base of the fastening device provides a housing defining a bore, that is, a socket of smaller diameter than the cap of the insulator. The socket is arranged with its axis coaxial with the axis of the cap, that is, coaxial with the axis of the insulator. A conductor clamp has a leg fitting into the socket rotatably therein. It may be held in the socket by screws extending through the socket wall and running in a groove in the leg of the clamp so that the clamp is rotatable in the socket through 360 degrees but is not releasable from the socket except by removal of the screws. The clamp itself is formed on that part of the leg extending out of the socket with its axis perpendicular to the leg to form a T, the clamp forming the web of the T and the leg forming the leg of the T.

In a second preferred embodiment, the base of the fastening device provides a leg and the clamp provides the housing with a socket therein, the remaining aspects of the second embodiment being similar to those of the first.

Pivotal movement of the clamp allows the installer to move the clamp in order to align it with a cable for engagement therewith. However, it has now been appreciated that the pivotal movement need not always be in the vertical plane. Thus, it is believed that prior art configurations were not strictly necessary. The new configuration of the improvement does allow movement of the clamp in the vertical plane when it is mounted to a horizontally aligned insulator. This allows the installer to align the clamp with vertical slope caused by sag in the cable. When the improved configuration is used on a vertical insulator, the clamp will be capable of movement in the horizontal plane. This may be of assistance in aligning the clamp with any sway in the cable but sway in heavy cables is less of a problem than sag. On a vertically aligned insulator, sag is less of a problem since once the clamp is aligned with the lowest relevant part of the cable, the position of the insulator may be adjusted to lift the clamp so that it encompasses the appropriate length of cable.

BRIEF DESCRIPTION OF THE DRAWINGS

Preferred embodiments of the invention are described in further detail with the use of the attached drawings wherein.

DETAILED DESCRIPTION OF PREFERRED EMBODIMENTS

Figure 1:
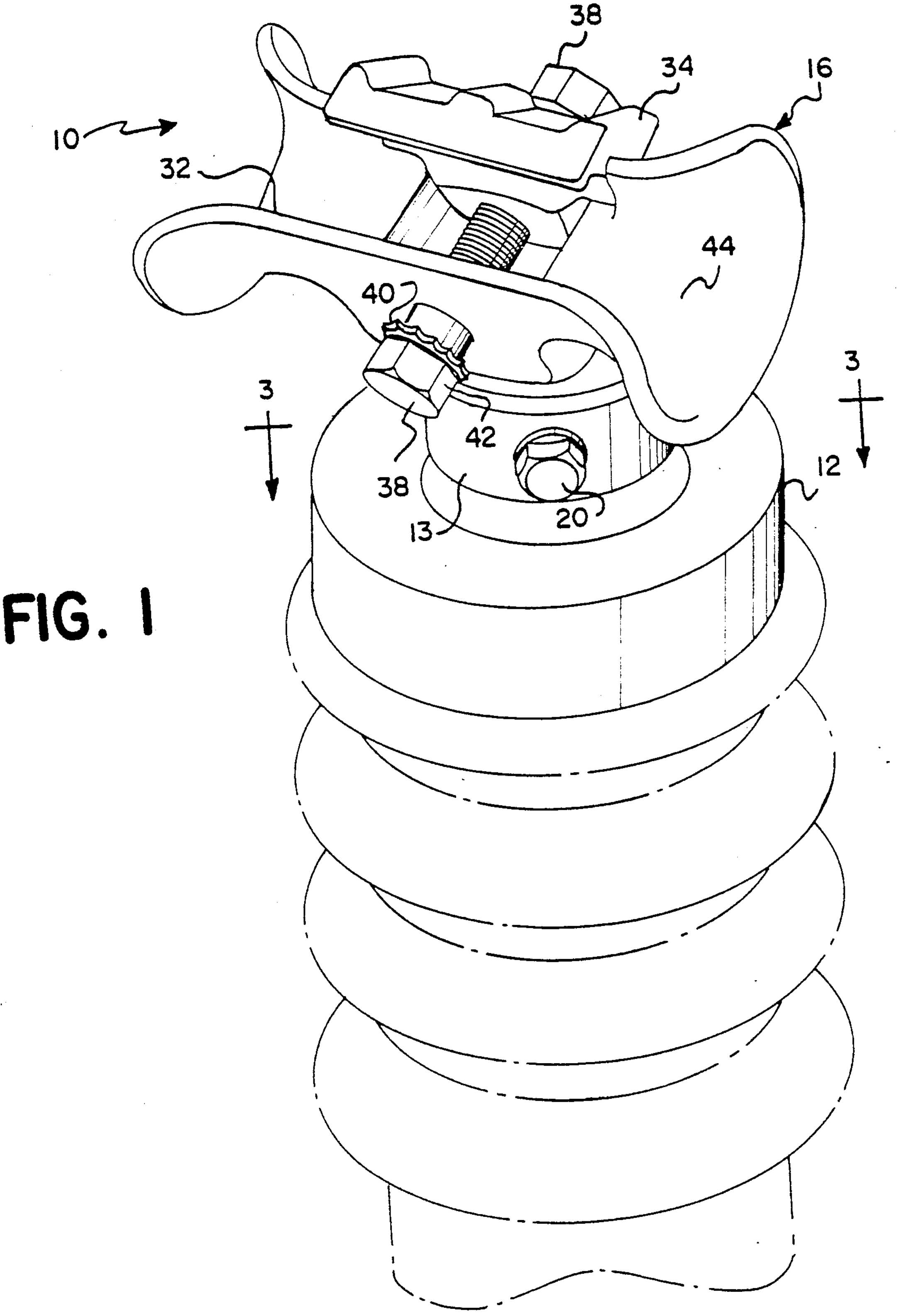
FIG. 1 is a perspective view of a first preferred embodiment oriented as it would be if vertically mounted on top of an insulator, shown in phantom.

In a first preferred embodiment, fastening device 10 has base 12 for mounting on an insulator. Integral with the base is a housing 13 defining a cylindrical socket 14 of interior circular section. The fastening element, vise 16, provides a leg or stem 18 of circular outer section inserted within the socket 14 and generally free to rotate therewithin. When fully installed, one or more bolts 20 are tightly screwed into threaded holes 22 and the free ends of their shanks 24 fit within circular groove 26 of leg 18 such that any attempted axial withdrawal of the leg from the socket brings the shanks into abutment with sides of the groove to hold the leg within the socket.

The vise generally forms a "T", the web of which is formed by jaws 32, 34 for compressive engagement of installed cable 36. A double-headed threaded bolt 38 threadingly engages jaw 34 such that revolution of the bolt 38 causes the jaw to travel axially along the threaded shank of the threaded bolt 38.

A metal ring washer 40 having radially extending twisted teeth interposes bolt head 42 and the outer surface of the jaw to enable longer-lasting fastening of the vise-cable arrangement.

Figure 2:
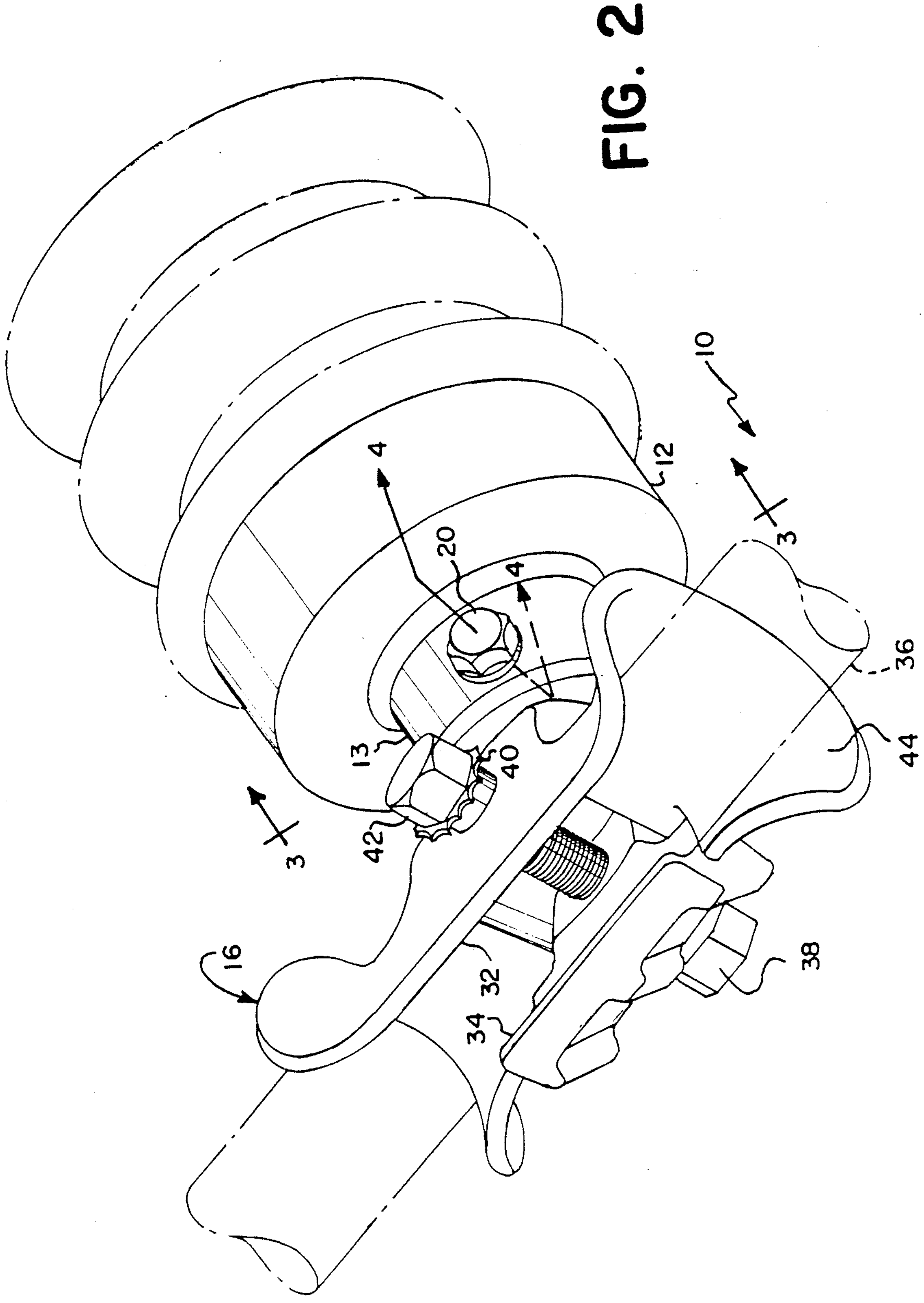
FIG. 2 is perspective view of the first preferred embodiment oriented as it would be mounted horizontally on an insulator, shown in phantom.
Figure 3:
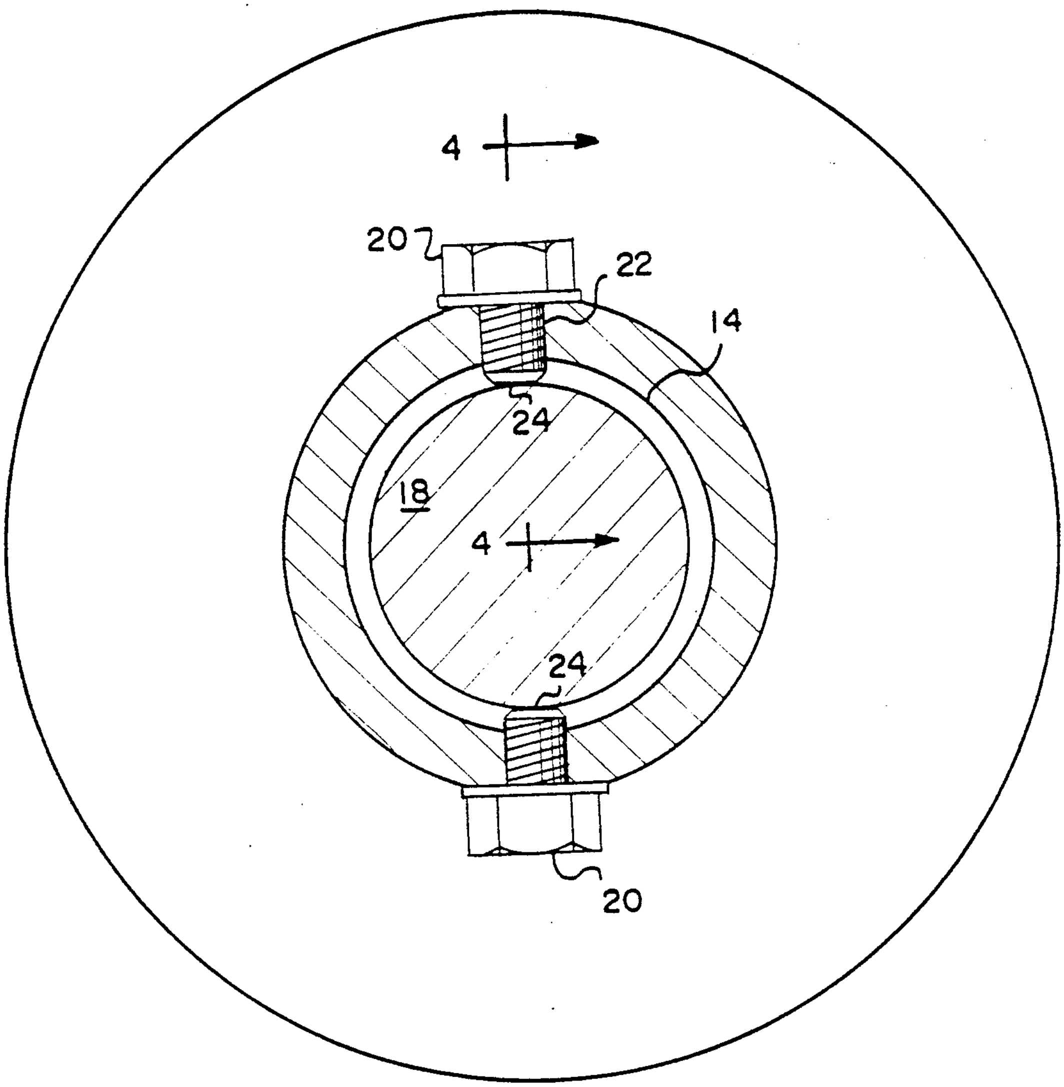
FIG. 3 is a sectional view taken along 3—3 in FIGS. 1 and 2.
Figure 4:
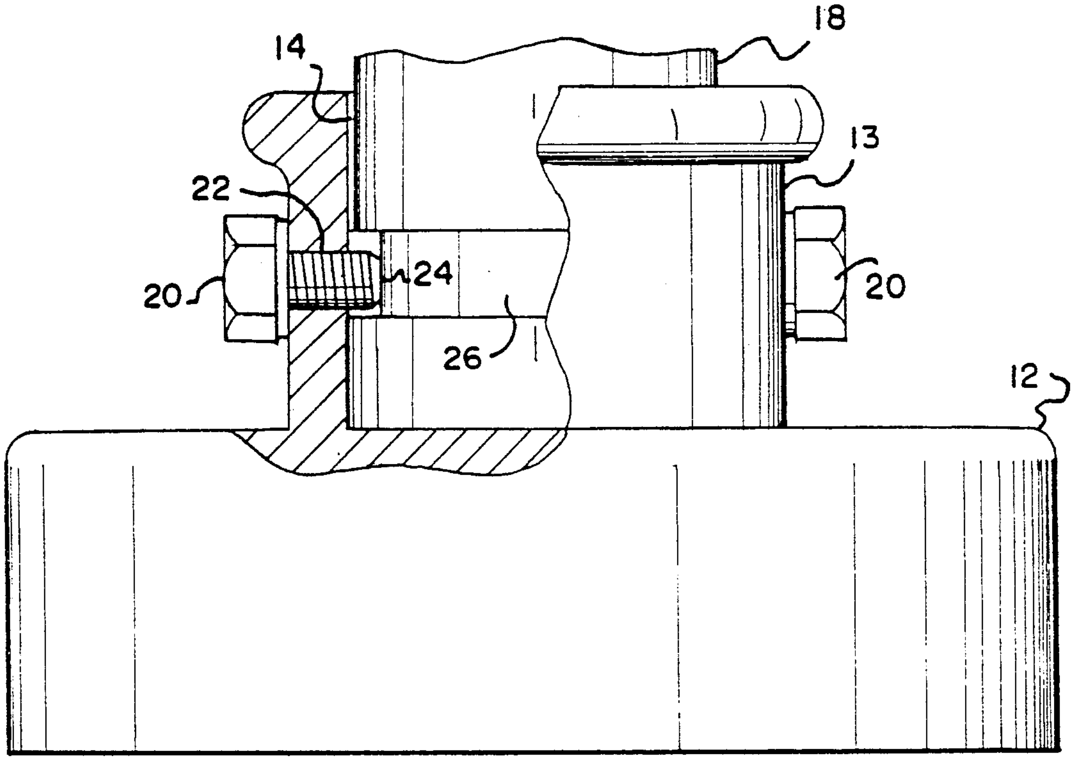
FIG. 4 is a partial sectional view taken along 4—4 in FIGS. 2 and 3.

The shape and orientation of a trough 44 of the vertically mounted fastener 10, as illustrated in FIG. 1, permits the resting of cable 36 therewithin during installation. Closure of the jaws on the cable secures the cable within the vise. Likewise, the shape and orientation of the trough 44 of horizontally mounted fastener 10, as illustrated in FIG. 2, permits the resting of the cable therewithin during installation. Generally, an installed cable drapes from either side of an insulator and may provide a substantially even or balanced weight on either side of the fastening device.

As illustrated in FIG. 2, the neutral axis of the cable fastened within the vise and the axis of rotation of the vise are mutually perpendicular.

A transmission cable generally has a diameter of between 0.375 to 1.00 inches, although transmission cables of larger diameter can be fastened with the invention. The distance of the neutral axis of an installed cable from the axis of rotation of the stem is preferably less than about 1.50 cable widths. The overall stability of the arrangement generally decreases if the cable is too greatly horizontally displaced from the central axis of rotation of a vertically mounted clamp, the preferred embodiment. The closer the cable is located to the axis of rotation, the smaller the degree of freedom a suspended cable clamped within the vise has to rotate, which correspondingly reduces the amount of galloping which may develop.

Bolts of greater length than those illustrated may be used to permit further tightening so that pivotal movement of the vise is stopped. This might reduce galloping further.

Figure 5:
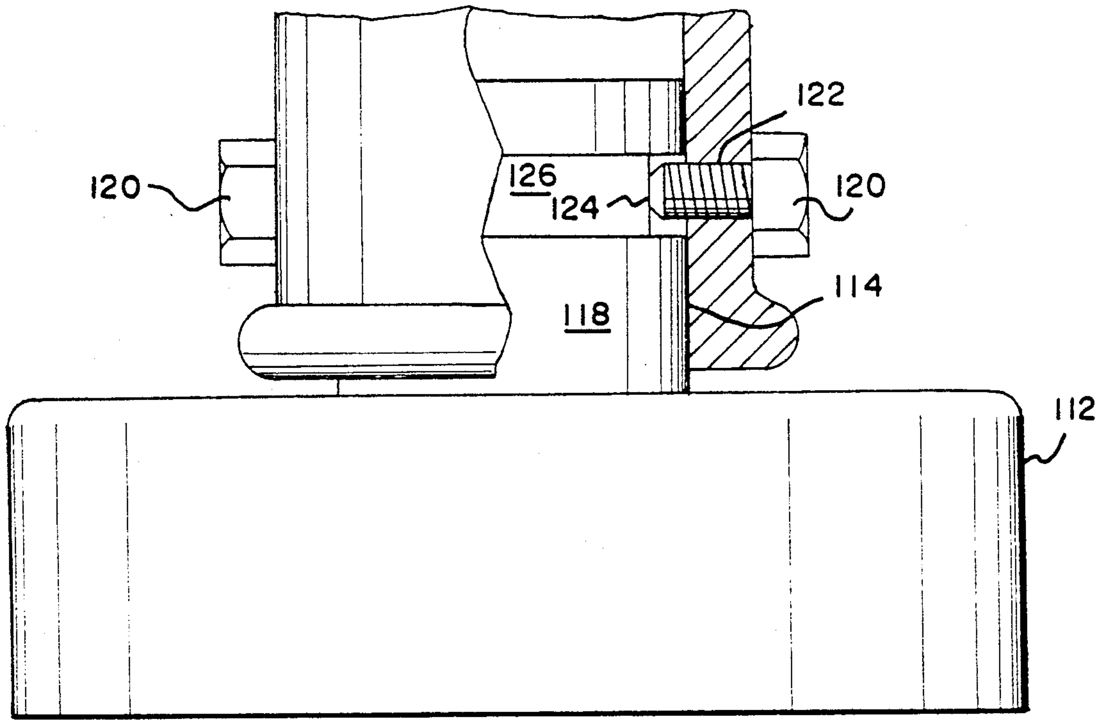
FIG. 5 is a partial sectional view analogous to FIG. 4 of a second preferred embodiment.

In a second preferred embodiment, illustrated in FIG. 5, the fastening device has a base 112 for mounting on an insulator. The vise provides a cylindrical socket 114 and the base provides a leg 118 of circular outer section inserted within the socket and generally free to rotate therewithin. When fully installed, bolts 120 are tightly screwed into threaded holes 122 and the free ends of their shanks 124 fit within a circular groove 126 of the leg such that any attempted axial withdrawal of the leg from the socket brings the shanks into abutment with sides of the groove to hold the leg within the socket.

An advantage of the second perferred embodiment over the first is that, when vertically mounted, the environmental elements are, to a large extent, excluded from the interior of the housing socket. The exclusion of water from a joint in a cold environment, for example, where the water may freeze and expand to damage the joint, is particularly advantageous. This is not to say that a rubber washer or the like could not be provided with the first embodiment in such a way as to protect the interior of its socket.

It is to be appreciated that the above description relates to a preferred embodiment of the present invention, and many variations are possible within the scope of the invention. In particular, the invention may be used to fasten non-conducting cables to supports other than insulators.

The detailed description of these embodiments is included to exemplify the invention, which is defined in the appended claims.

What is claimed is:

1. A device for fastening an electrical cable to an insulator, said device comprising a base and a fastening element, one of said base and said fastening element having a fixed stem extending therefrom and the other of said base and said fastening element having a bore for receiving said stem, said fastening element being mounted for swivelling relative to said base about an axis of rotation, said base being an electrically conducting member having means for attachment to said insulator and said fastening element having a vise including jaws movable between an open position for receiving said cable within a trough and a closed position for fastening said cable within said trough to define a neutral axis between said jaws such that said neutral axis is located substantially adjacent to said axis of rotation, and means for selectively preventing said fastening element from rotating relative to said base including a fastener which passes into said bore and into a circumferential groove formed in said stem such that in a first position, said fastener engages said stem and prevents rotation of said stem within said bore, and in a second position, said fastener is moved out of engagement with said stem to permit free rotation of said stem within said bore.

2. The device of claim 1 wherein said neutral axis passes within 1.50 diametrical cable widths of said axis of rotation.

3. The device of claim 1 wherein said neutral axis intersects said axis of rotation.

4. The device of claim 1 wherein said stem includes a circular cylinder having a central axis coaxial with said axis of rotation, said circumferential groove is parallel to a plane perpendicular to said axis of rotation, and said fastener is located and dimensioned to project within said groove to permit rotation of said stem about said axis of rotation while precluding withdrawal of said stem from said bore.

5. The device of claim 1 having two fasteners located diametrically opposite to each other with respect to said axis of rotation.

6. The device of claim 1 wherein said fastener is a threaded bolt received for rotation within a threaded aperture in said bore.

7. The fastening device of claim 1 wherein the base and the fastening device are formed of a metal.

8. A fastening device for use with a cable to be mounted on a support having a central axis, comprising:

a base including first and second opposing outer sides, support mounting means on the first side of the base for mounting the base to the support, and a housing on the second side of the base, the housing defining a circular cylindrical bore having a central axis coaxial with the central axis of the support when the base is mounted thereon; and a fastener element including a stem dimensioned to be mounted within the housing such that a central axis of the stem is substantially coaxial with the central axis of the bore and is rotatable thereabout, means for rotatably securing the stem when within the housing, and a vise on the stem having first and second jaws connected thereto;

wherein the first jaw is rigidly connected to the stem, the second jaw is connected so as to be movable between an open position and a closed position, and the jaws are shaped, dimensioned and oriented to receive the cable therebetween when the second jaw is in the open position such that subsequent movement of the second jaw into the closed position results in fastening of the cable between the jaws with a neutral axis of the cable located substantially perpendicular to the central axis of the stem and bore.

9. The fastening device of claim 8 wherein the support mounting means includes means for engaging an insulator support.

10. A fastening device for use with a cable to be mounted on a support having a central axis, comprising:

a base including first and second opposing outer sides, support mounting means on the first side of the base for mounting the base to the support, and a stem protruding from the second side of the base and having a central axis coaxial with the central axis of the support when the base is mounted thereon; and a fastener element including a housing defining a circular cylindrical bore dimensioned such that the stem may be inserted therewithin, means for rotatably securing the stem when inserted within the housing, and a vise on the housing having first and second jaws connected thereto;

wherein the first jaw is rigidly connected to the housing, the second jaw is connected so as to be movable between an open position and a closed position, and the jaws are shaped, dimensioned and oriented to receive the cable therebetween when the second jaw is in the open position such that subsequent movement of the second jaw into the closed position results in fastening of the cable between the jaws with a neutral axis of the cable located substantially perpendicular to the central axis of the stem and bore.

11. The fastening device of claim 10 wherein the support mounting means includes means for engaging an insulator support.

12. A fastening device for use with a cable, comprising:

a base having first and second opposing outer sides, mounting means on the first side of the base, and a housing on the second side of the base, the housing defining a circular cylindrical bore with a central axis; and a fastener element having a stem dimensioned to be mounted within the housing such that a central axis of the stem is substantially coaxial with the central axis of the bore and is rotatable thereabout, means for rotatably securing the stem when within the housing, and a vise on the stem having first and second jaws connected thereto;

wherein the first jaw is rigidly connected to the stem, the second jaw is connected so as to be movable between an open position and a closed position, and the jaws are shaped, dimensioned and oriented to receive the cable therebetween when the second jaw is in the open position such that subsequent movement of the second jaw into the closed position results in fastening of the cable between the jaws with a neutral axis of the cable located substantially perpendicular to the central axis of the stem and bore.

13. The fastening device of claim 12 wherein the mounting means includes means for engaging an insulator support.

* * * * *